(12) United States Patent
Culler et al.

(10) Patent No.: US 8,181,125 B2
(45) Date of Patent: May 15, 2012

(54) SYSTEM AND METHOD FOR PROVIDING COMPLIANT MAPPING BETWEEN CHIP BOND LOCATIONS AND PACKAGE BOND LOCATIONS FOR AN INTEGRATED CIRCUIT

(75) Inventors: Jason Harold Culler, Livermore, CO (US); Shad R. Shepston, Thornton, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2210 days.

(21) Appl. No.: 10/212,360

(22) Filed: Aug. 5, 2002

(65) Prior Publication Data

US 2004/0025126 A1 Feb. 5, 2004

(51) Int. Cl.
*G06F 17/50* (2006.01)
(52) U.S. Cl. ........... 716/52; 716/50; 716/51; 716/54; 716/106; 716/111
(58) Field of Classification Search .......... 716/1, 3–5, 716/15, 19, 21, 50–56, 106, 111; 438/108
See application file for complete search history.

(56) References Cited

U.S. PATENT DOCUMENTS

| | | | |
|---|---|---|---|
| 5,786,630 A | 7/1998 | Bhansali et al. | |
| 6,075,712 A | 6/2000 | McMahon | |
| 6,262,579 B1 * | 7/2001 | Chazan et al. | 324/537 |
| 6,310,398 B1 * | 10/2001 | Katz | 257/773 |
| 6,389,558 B1 * | 5/2002 | Herrmann et al. | 714/39 |
| 6,396,707 B1 | 5/2002 | Huang et al. | |
| 6,470,489 B1 * | 10/2002 | Chang et al. | 716/21 |
| 6,569,694 B1 * | 5/2003 | Sarma et al. | 438/14 |
| 6,581,189 B1 * | 6/2003 | Tain | 716/3 |
| 6,581,196 B2 * | 6/2003 | Eisenberg et al. | 716/5 |
| 6,593,168 B1 * | 7/2003 | Ehrichs et al. | 438/108 |
| 6,617,943 B1 * | 9/2003 | Fazelpour | 333/204 |

* cited by examiner

*Primary Examiner* — Paul Dinh

(57) ABSTRACT

A system and method for providing compliant mapping between chip bond locations of an IC and corresponding package bond locations is disclosed. Package design information including package bond location information relating to the IC package and IC mask data including chip bond location information relating to the IC chip are integrated such that an internal physical design verification tool is operable to verify compliance between package bond locations and chip bond locations.

30 Claims, 6 Drawing Sheets

US 8,181,125 B2

SYSTEM AND METHOD FOR PROVIDING COMPLIANT MAPPING BETWEEN CHIP BOND LOCATIONS AND PACKAGE BOND LOCATIONS FOR AN INTEGRATED CIRCUIT

BACKGROUND OF THE INVENTION

1. Technical Field of the Invention

The present invention generally relates to the field of integrated circuit (IC) and package design. More particularly, and not by way of any limitation, the present invention is directed to a system and method for providing compliant mapping between chip bond locations and package bond locations for a packaged integrated circuit.

2. Description of Related Art

Traditional IC product flow moved from IC design to package design to printed circuit board (PCB) design to manufactured product. Typically, each stage of the process was optimized in isolation of the other stages. The increasing functionality and performance of ICs, time-to-market pressures, and cost constraints, however, have challenged this traditional flow. To provide ICs having increased input/output densities and complex, high pin-count packages in a constrained time period, IC design, package design, and PCB design have become integrated so as to support a unified manufacturing flow, with a view to increasing performance and reliability, and decreasing the time-to-market and manufacturing costs.

In support of this paradigm, the functional requirements of the IC design, package design, and PCB design are optimized concurrently. In particular, in modern design flow, the package design specifications are developed and verified concurrently with the placement and routing of the actual IC circuitry and its physical pinout requirements. A physical design verification tool verifies that the mapping between chip bond locations of an IC chip and package bond locations of its package is compliant. For example, physical design verification tools can verify that the electrical connects between the chip bond locations and package bond locations are free from short circuits.

Typically, the physical verification tool comprises a series of custom executable external scripts that access and manipulate data from several electronic design automation (EDA) and related computer aided design (CAD) tools. For example, an external script may be developed to access and manipulate package design information to prepare the package design information for a verification script. A second external script may be developed to access and manipulate IC mask data information to prepare the IC mask data information for the verification script. Finally, a third external verification script may be developed to import data prepared by the other scripts and perform the design verification.

It has been found, however, that the existing external piecemeal script schemes are not without limitations. Each time a highly complex EDA/CAD database, e.g., a mask database of a chip is accessed and manipulated by a script, there is an inherent risk of corrupting the data, giving rise to errors that can reduce yield. Moreover, the tight tolerances of today's high density, multilayer packages and the ever-increasing geometric requirements of ICs adversely compound the cumulative probability of error. Therefore, the existing script schemes are error-prone and do not accurately verify compliant mapping on a consistent basis.

SUMMARY OF THE INVENTION

A system and method for providing compliant mapping between chip bond locations of an IC and corresponding package bond locations is disclosed. Package design information including package bond location information relating to the IC package and IC mask data including chip bond location information relating to the IC chip are integrated such that an internal physical design verification tool is operable to verify compliance between package bond locations and chip bond locations.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1A:
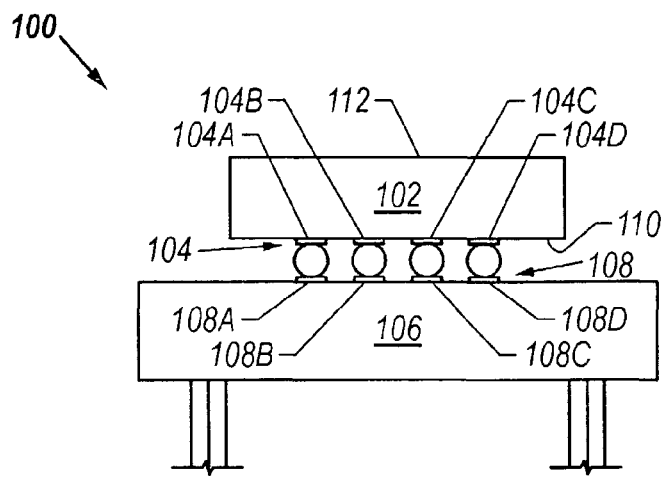
FIG. 1A depicts a side view of an embodiment of a compliant control collapse chip connection (C4) chip and package assembly.

In the drawings, like or similar elements are designated with identical reference numerals throughout the several views thereof, and the various elements depicted are not necessarily drawn to scale. Referring now to FIG. 1A, an embodiment of a control collapse chip connection (C4) chip and package assembly 100 is depicted. A C4 chip 102, commonly referred to as a "flip chip," having chip bond locations 104 is electrically coupled to a Pin Grid Array (PGA) package 106 having package bond locations 108. By way of example, the chip bond locations 104 on the C4 chip 102 may comprise pins or bump pads and the package bond locations 108 may comprise contact pads in the form of solder bumps.

The C4 chip 102 has a top surface 110 and a bottom surface 112. The active regions (not shown) of the C4 chip 102 are formed within the top surface 110. Accordingly, the die must be flipped upside down to be attached to the package 106. The PGA package 106 connects to a PCB (not shown) via an array of pins that are inserted into corresponding through-hole pads of the PCB.

The system and method for providing compliant bond/pad mapping in accordance with the teachings of the present invention may be practiced at any stage of the manufacturing flow process. In one embodiment, by practicing the invention early in the process, the mapping between the chip bond locations 104 and package bond locations 108 of C4 package assembly 100 may be verified to be compliant prior to the construction and manufacture of the C4 chip and its package.

Compliant mapping, as will be discussed in more detail below, between chip bond locations 104 and package bond locations 108 includes an accurate correspondence therebetween with respect to function, number, and alignment. As illustrated, chip bond locations 104A-D correspond to package bond locations 108A-D, respectively. Depending on the structure of the circuitry connected to the chip bond location, each chip bond location may be named by function as a no-connect, power terminal, ground terminal, clock terminal, or signal terminal, for example. The function of a particular chip bond location must match the function of the corresponding package bond location. For example, a power terminal must be connected to a power terminal, not a ground or signal terminal. In the illustrated embodiment, each chip bond location 104A-D is provided as a signaling terminal and each package bond location 108A-D is provided as a corresponding signaling terminal. Therefore, there exists compliant mapping therebetween with respect to functionality.

Additionally, a compliant IC and package assembly should have a correspondence between the number of chip bond locations 104 and package bond locations 108. That is, an identical number of chip bond locations 104 and package bond locations 108 should be present. A missing bond location or an excess bond location may render the chip and package assembly 100 inoperable. As illustrated, the four chip bond locations 104A-D correspond to the four package bond locations 108A-D. Therefore, a correspondence with respect to number is present.

Moreover, the IC and package assembly 100 should have a correspondence between the alignment of the chip bond locations 104 and package bond locations 108. If a chip bond location 104 does not align with a package bond location 108, a complete connection may not be made between the chip 102 and package 106. Also, electrical shorts may develop between two adjacent locations wherein one location is displaced or misaligned. Chip bond locations 104A-D are illustrated to be in alignment with the package bond locations 108A-D, respectively. Accordingly, correspondence between chip bond locations and package bond locations is present with respect to function, number, and alignment, and the mapping therebetween is deemed to be compliant.

Although the assembly 100 is depicted as comprising a C4 chip and a PGA package, it should be appreciated by those skilled in the art that other IC interface and connection schemes known in the art are within the teachings of the present invention. For example, besides a PGA, the interface schemes for the IC may include Ball Grid Arrays (BGAs) or Land Grid Arrays (LGAs), chip carriers, or any other type of packaging.

Figure 1B:
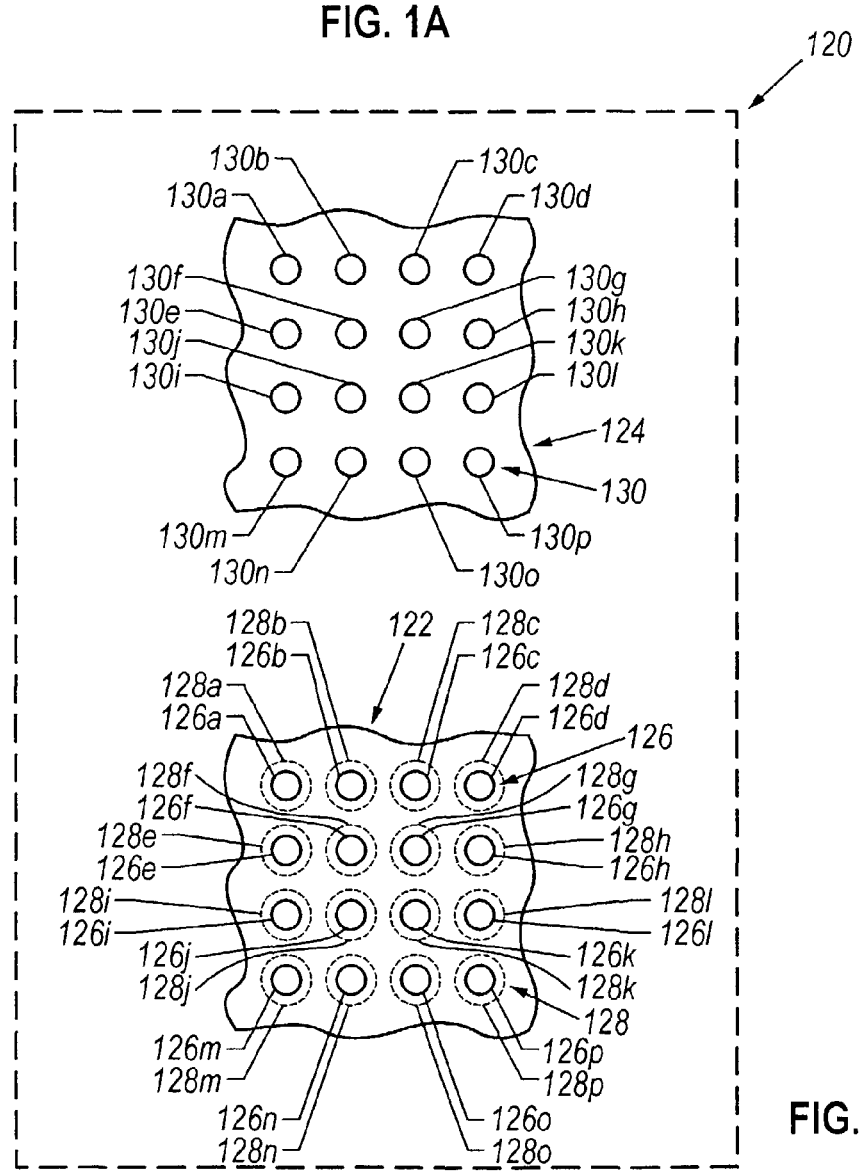
FIG. 1B depicts a partial top view of a graphical representation of the chip bond location information and package bond location information for the C4 chip illustrated in FIG. 1A.

Referring now to FIG. 1B, an exemplary graphical or virtual representation 120 of the package bond location information 122 and the chip bond location information 124 is presented. In one embodiment, early in the design flow process, once the IC design has been placed and routed, an internal physical design verification tool, such as a design rule check (DRC), may test the resultant layout to ensure that various packaging requirements are satisfied prior to the manufacture of the IC.

Package bond location information 122 and chip bond location information 124 are virtual representations of the package bond location information and chip bond location information obtained from the package design and IC mask databases, respectively. A script obtains the package bond location information 122 from the package design information stored in a design layout database tool such as an EDA/CAD system. EDA/CAD systems support a layout editor for generating a layout database which provides the geometric design of a package. The layout database may be represented in a standard format such as the Cadence Advanced Package Designer (APD) format, or Cadence Advanced Package Engineer (APE) format, or in some other proprietary format. The layout database typically includes geometric parameters associated with geometric objects, or geometries, (e.g., circles, etc.) specifying the position, dimension, and function of different layers of materials that represent the package. The geometries are typically converted into respective rectangles or circles and arranged according to their physical location and commonly represented by parameter values in the form of coordinates.

In the graphical representation of the package bond information 122, package bond locations 126 are geometric shapes, i.e. circles, that represent the package bond locations in the design of the package of FIG. 1A. Additionally, each virtual package bond location 126a-p includes a name that reflects a function such as the aforementioned power terminal, signal terminal, etc. Although circles are illustrated in a square or grid array, it should be understood by those skilled in the art that the graphical representation of the package bond locations 126 may be of a variety of shapes and geometries.

In accordance with one embodiment of the present invention, a bumper boundary is positioned about each package bond location 126. The bumper boundaries 128a-p add to the perimeter of the virtual package bond locations, 126a-p, to modify the physical design tolerances of the package design. The exact dimensions of the bumper boundary 128 may depend on a variety of design criteria such as, for example, the line, terminal, and dielectric requirements of a particular layout. It will be recognized that although each virtual package bond location is illustrated with a corresponding bumper boundary, the actual number of the package bond locations provided with bumper boundaries can be variable.

The virtual chip bond location information 124 may be accessed in an EDA/CAD database that represents IC mask data in a standard format such as the Cal-Tech Intermediate Format (CIF), the graphics design system (GDS) format, the graphics design system II (GDS2) format, or in some other proprietary format. Similar to the package database format tools, the IC layout database formats geometrically represent the design specifications of the chip. In the graphical representation of the chip bond information, circular virtual chip bonds 130 represent the placement of chip bond locations in the design of the chip of FIG. 1A. Additionally, each virtual chip bond location 130a-p includes a name that reflects its function such as power, ground, active signal, clock, and the like.

Once the package design information is obtained and the IC mask data information is accessed, an internal physical design verification tool may be utilized to ensure that various packaging requirements are satisfied. In one embodiment, a script imports the package design information 122 into the graphical representation space 120 that comprises a chip design information space, such as an IC mask information space. Then a design rules check (DRC) tool verifies the aforementioned function, number, and alignment correspondence between the chip bond location information and the package bond location information.

Continuing with the description of the graphical representation space, the DRC verifies compliance by comparing the package bond information 122 with the chip bond information 124. In one embodiment, when the graphical representation of the package bond information 122 is superimposed onto the graphical representation of the chip bond information 124, the functions, number and alignment of the respective bonds are expected to correspond. More specifically, the functions of the specified package bond locations must correspond to the functions of the chip bond locations. Likewise, the number of package bond locations must correspond to the number of chip bond locations. Moreover, the package bond locations and chip bond locations should be aligned within a specified degree of tolerance. Where there is a non-correspondence with respect to any of these package design parameters, the flow must be re-worked before the design is committed to fabrication. Examples of noncompliant chip and package assemblies are presented and discussed in detail hereinbelow.

It should be understood that the function, number, and alignment correspondence rules set forth above can also include conventional design rules used to confirm a particular design layout's quality before construction of the IC. Therefore, the mapping compliance rules of the present invention may be readily modified to confirm that a given layout complies with any package design requirement, criterion, or preference stated with sufficient particularity.

Figure 2A:
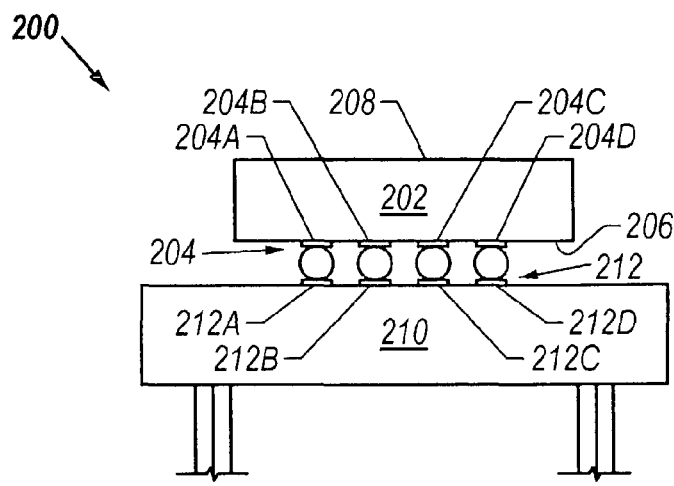
FIG. 2A depicts a side view of an embodiment of a C4 chip and package assembly wherein the mapping is noncompliant due to a naming error.

Referring now to FIG. 2A, an embodiment of a C4 chip and package assembly 200 having noncompliant mapping due to a naming error is presented. Similar to FIG. 1A, a C4 chip 202 having chip bond locations 204, a top surface 206, and a bottom surface 208 is electrically coupled to a PGA package 210 having a plurality of package bond locations 212. Chip bond locations 204A-D correspond to package bond locations 212A-D. The mapping between the chip bond locations is noncompliant, however, as the chip bond location 204D is exemplified as a power terminal whereas the package bond location 212D is provided as a signal terminal.

Figure 2B:
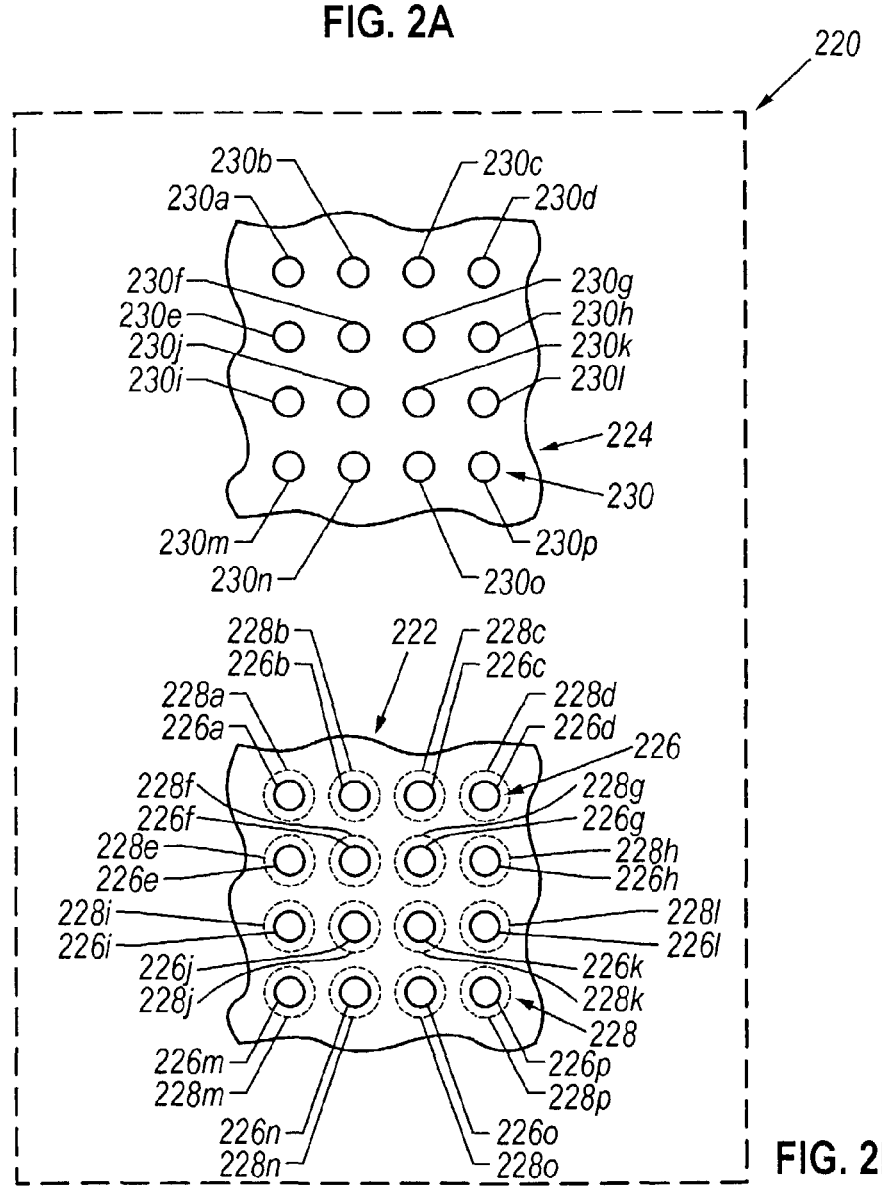
FIG. 2B depicts a partial top view of a graphical representation of the chip bond location information and package bond location information for the C4 chip illustrated in FIG. 2A.

A graphical representation 220 of the package bond location information and chip bond location information that is a part of the design of the C4 chip and package assembly of FIG. 2A is presented in FIG. 2B. Similar to FIG. 1B, virtual package bond information 222 includes virtual package bond locations 226 with bumper boundaries 228 and virtual chip bond information 224 includes virtual chip bond locations 230.

To verify the mapping between the chip bond locations 230a-p and package bond locations 226a-p is compliant, the internal design verification tool checks the virtual package bond locations 226a-p against the virtual chip bond locations 230a-p. For purposes of illustration, chip bond location 230h is provided as a power terminal and the corresponding package bond location 226h is provided as a signal terminal. Accordingly, functional names between the chip bond locations 230 and package bond locations 226 will be determined to be noncompliant. While the compliance verification may be visualized as the superposition of the virtual package bond information onto the chip bond information, the actual operations of the present invention may be conducted by a series of scripts, such as Perl scripts, executable in any computer or computational environment.

Figure 3A:
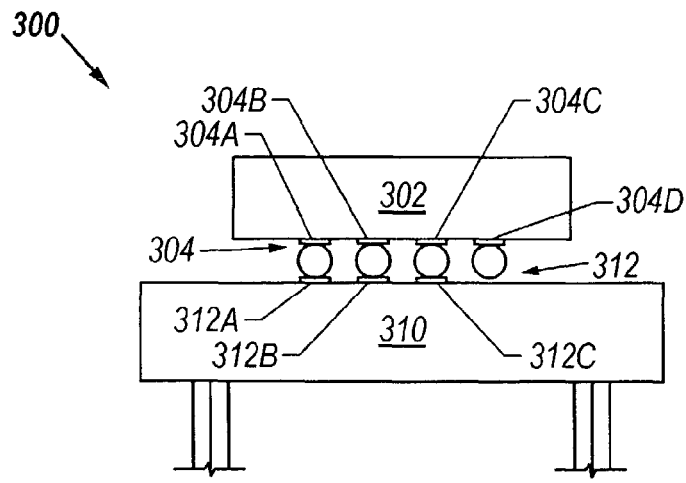
FIG. 3A depicts a side view of an embodiment of a C4 chip and package assembly wherein the mapping is noncompliant due to a missing package bond location.
Figure 3B:
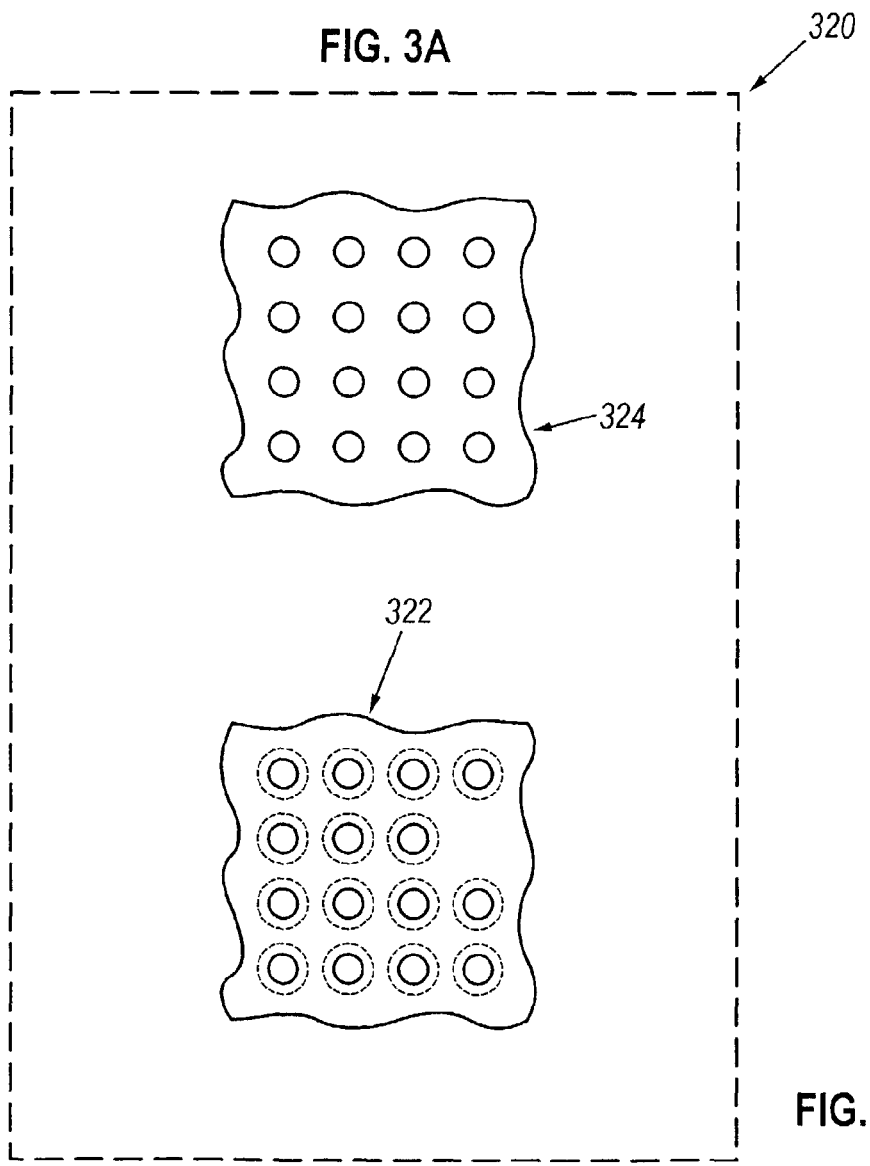
FIG. 3B depicts a partial top view of a graphical representation of the chip bond location information and package bond location information for the C4 chip illustrated in FIG. 3A.

Referring now to FIG. 3A, an embodiment of a C4 chip and package assembly 300 having noncompliant mapping due to a missing chip bond location is presented. Similar to FIGS. 1A and 2A above, a C4 chip 302 having chip bond locations 304 is electrically coupled to a PGA package 310 having package bond locations 312. Whereas chip bond locations 304A-C correspond to package bond locations 312A-C, the mapping between the chip bond locations is noncompliant as the chip has an extra bond location, chip bond location 304D. FIG. 3B depicts a graphical representation space 320 of this condition wherein bond location information does not correspond between the package space 322 and chip space 324.

Figure 4A:
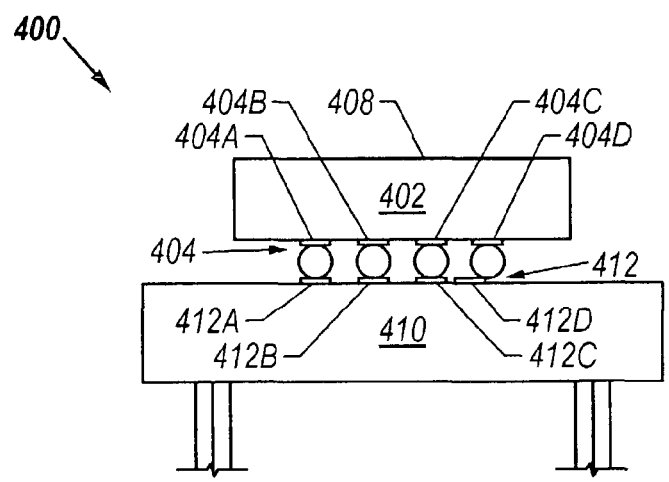
FIG. 4A depicts a side view of an embodiment of a C4 chip and package wherein the mapping is noncompliant due to a misaligned package bond location.
Figure 4B:
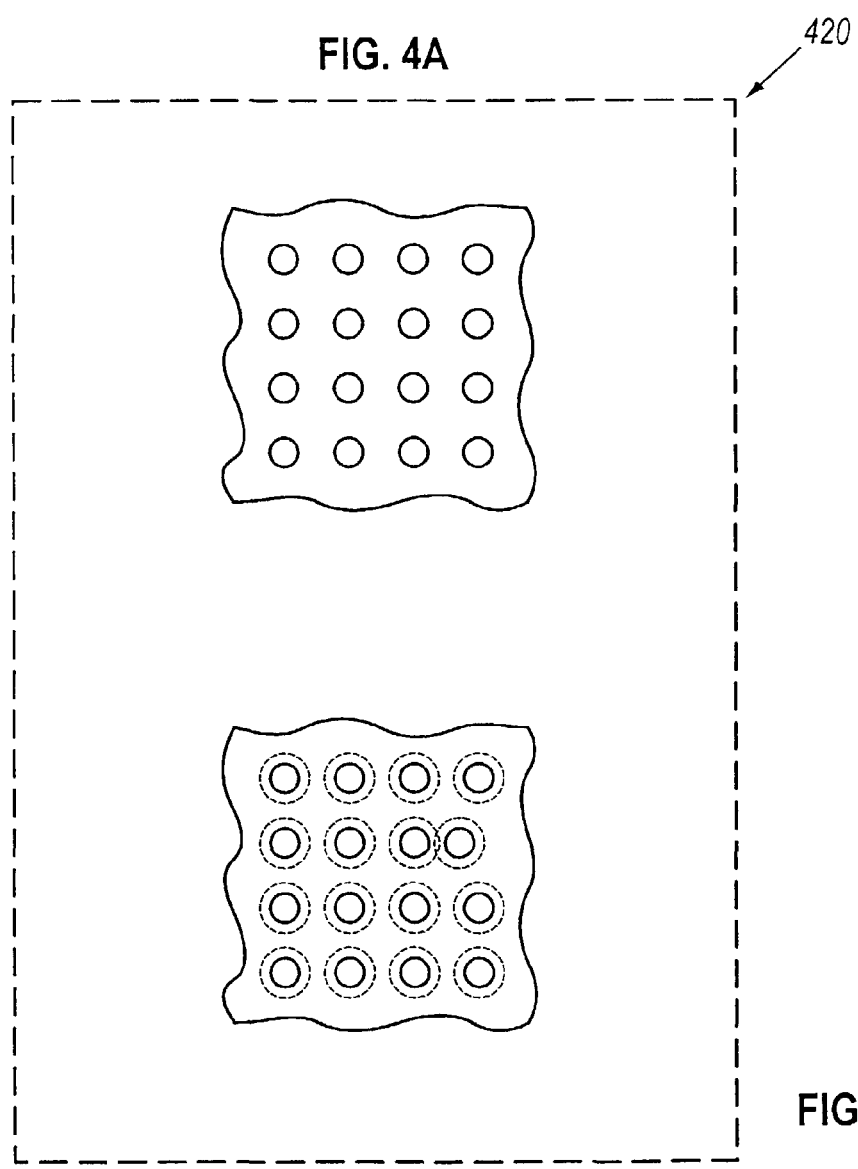
FIG. 4B depicts a partial top view of a graphical representation of the chip bond location information and package bond location information for the C4 chip illustrated in FIG. 4A.

Referring now to FIG. 4A, an embodiment of a C4 chip and package assembly 400 having noncompliant mapping due to a displaced/misplaced chip bond location is presented. A C4 chip 402 having chip bond locations 404 is electrically coupled to a PGA package 410 having package bond locations 412. Although chip bond locations 404A-D correspond to package bond locations 412A-D in terms of the number, the mapping between the bond locations is noncompliant as the chip bond location 404D and package bond location 412D do not align. FIG. 4B depicts a graphical representation space 420 of the package bond location information that illustrates this condition.

Figure 5:
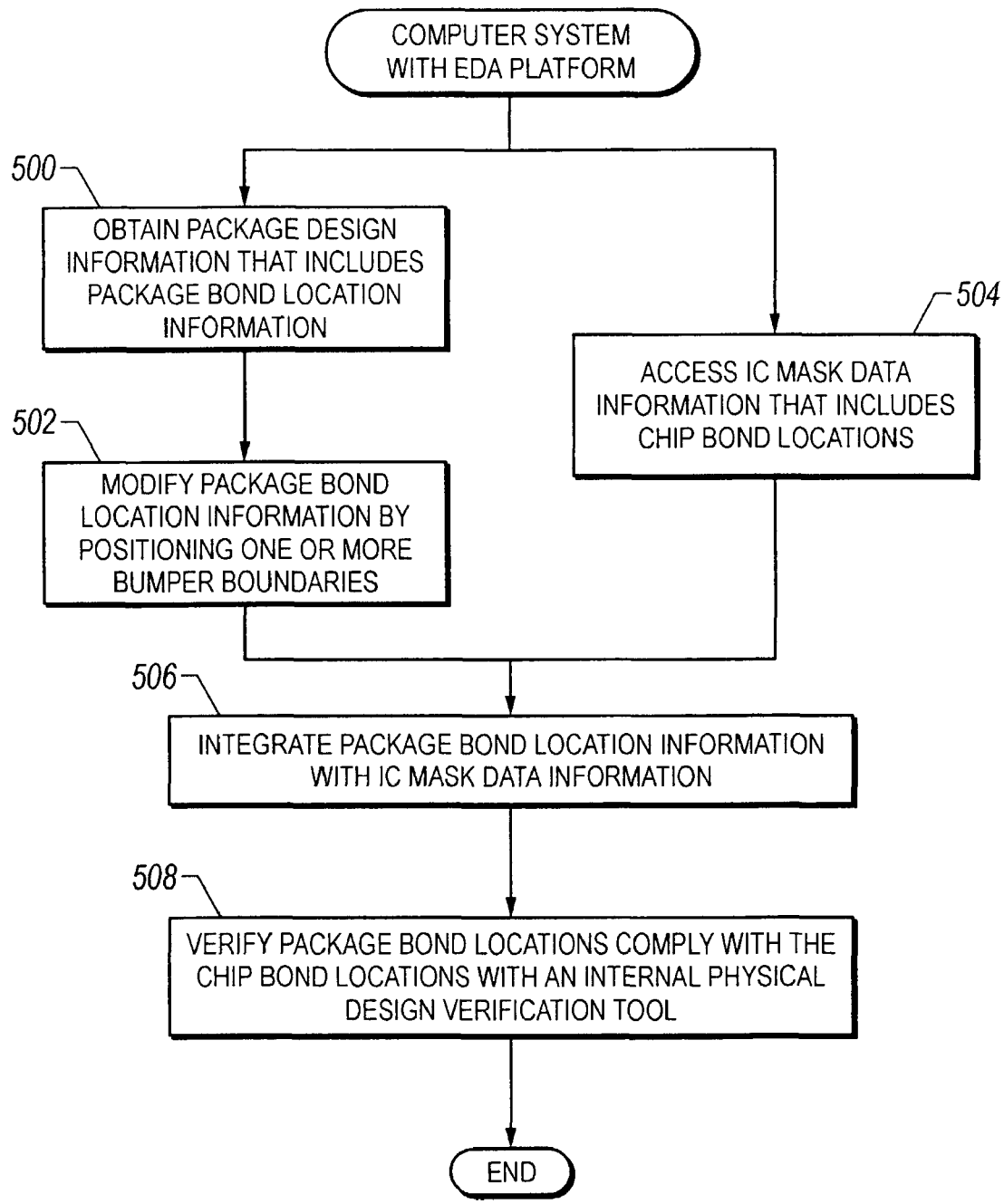
FIG. 5 depicts a flow chart of the various operations involved in one embodiment of a method for providing compliant mapping between chip bond locations of an IC chip and package bond locations of a package in which the IC chip is to be positioned.

FIG. 5 depicts a flow chart of the various operations involved in one embodiment of a method for providing compliant mapping between chip bond locations of an IC chip and package bond locations of a package in which the IC chip is to be positioned. At block 500, package design information that includes package bond information is obtained. As discussed, a script is employed to access package design information from a formatted layout database. At block 502, a script is employed to modify the package bond location information by positioning bumper boundaries around one or more package bond locations. At block 504, IC mask data information that includes chip bond locations is accessed. It should be understood that although operations 500 and 502 and operation 504 are illustrated as being conducted concurrently, the operations may be conducted in any sequence or combination.

At block 506, the package bond location information is integrated with the mask data information. At block 508, an internal physical design verification tool is employed to ensure that the package bond locations comply with the chip bond locations. In one embodiment, a DRC tool verifies that the function, number, and alignment of the package bond locations correspond with the function, number, and alignment of the chip bond locations. The method of the present invention thereby provides compliant mapping between chip bond locations and package bond locations in a packaged integrated circuit wherein the package data is integrated within a mask database so as to avoid data corruption. Since the compliance verification scheme of the present invention does not alter or modify the chip bond location information, the present invention reduces error and provides a more robust compliant mapping technique.

Figure 6:
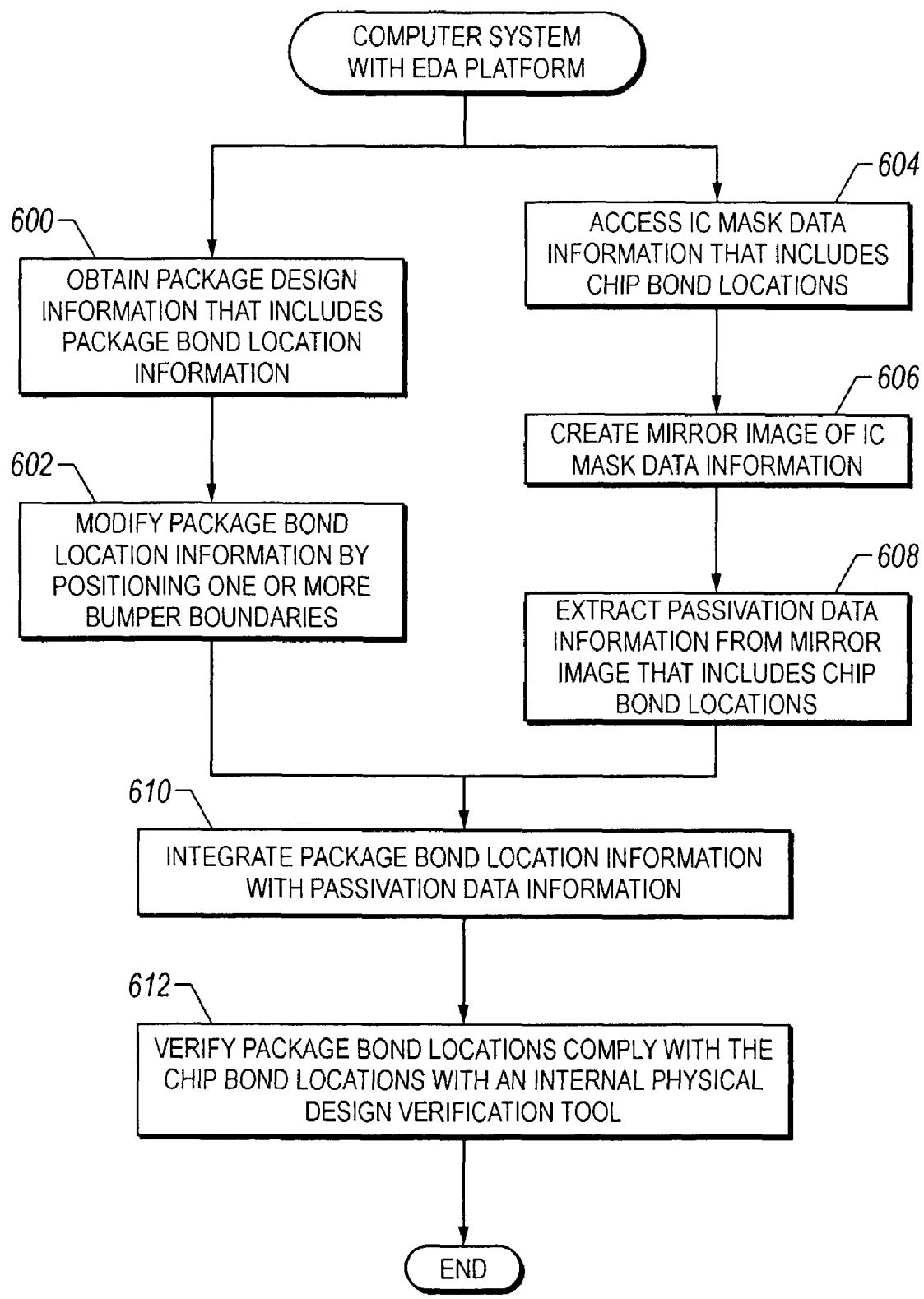
FIG. 6 depicts a flow chart of the various operations involved in another embodiment of a method for providing compliant mapping between chip bond locations of an IC chip and package bond locations of a package in which the IC chip is to be positioned.

A flow chart of another embodiment of the present invention is illustrated in FIG. 6. Similar to the flow shown in FIG. 5, package design information that includes package bond information is obtained at block 600. At block 602, a script is employed to modify the package bond location information by positioning bumper boundaries around one or more package bond locations. At block 604, IC mask data information that includes chip bond locations is accessed. At block 606, a script creates a mirror image of the IC mask data information. At block 608, a script extracts the passivation/bond pad data information from the mirror database image. The passivation data information includes the chip bond location information that is integrated with the package bond location information at block 610. At block 612, an internal physical design verification tool verifies that the package bond locations comply with the chip bond locations.

Based on the foregoing, it should be appreciated that the system and method of the present invention provides a robust verification scheme that achieves compliant mapping between chip bond locations and package bond locations in an IC by significantly minimizing the probability of database corruption. By reducing the number of external scripts and executing the compliance testing within the IC mask database space or another trusted database space, the compliant mapping scheme of the present invention is particularly advantageous for ICs with an increased number of pins, decreased package footprint, and high density of package pins.

Although the invention has been described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A design methodology for providing compliant mapping between chip bond locations of an integrated circuit (IC) chip and package bond locations of a package in which said IC chip is to be positioned, the method the design methodology includes a method comprising the steps:
   obtaining package design information relating to said package, said package design information including package bond location information;
   accessing IC mask data information relating to said IC chip, said IC mask data information including chip bond location information for said IC chip;
   integrating said package bond location information with said IC mask data information, said package bond location information comprising a virtual representation of a plurality of package bonds for said package and said IC mask data information comprising a virtual representation of a plurality of chip bonds of said IC chip; and
   verifying that said package bond location information matches said chip bond location information by using an internal physical design verification tool, wherein the internal physical design verification tool is implemented by a computer.

2. The design methodology as set forth in claim 1, further comprising the step of modifying said package bond location information by positioning a bumper boundary around at least one of said package bond locations.

3. The design methodology as set forth in claim 1, wherein the step of verifying that said package bond location information matches said chip bond location information further comprises the step of verifying that said package bond locations align with said chip bond locations.

4. The design methodology as set forth in claim 1, wherein the step of verifying that said package bond location information matches said chip bond location information further comprises the step of verifying that package bond location names of said package bond locations correspond with chip bond location names of said chip bond locations.

5. The design methodology as set forth in claim 1, wherein the step of verifying that said package bond location information matches said chip bond location information further comprises the step of verifying that the number of said package bond locations corresponds with the number of chip bond locations.

6. The design methodology as set forth in claim 1, wherein the step of accessing IC mask data information relating to said IC chip further comprises the steps of:
   creating a mirror image of said IC mask data information; and
   extracting passivation data from mirror image data, said passivation data including chip bond location information for said IC chip.

7. The design methodology as set forth in claim 1, wherein said internal physical design verification tool includes a Design Rules Check (ARC) tool.

8. The design methodology as set forth in claim 1, wherein said package design information includes information in an Advanced Package Designer (APD) format.

9. The design methodology as set forth in claim 1, wherein said IC mask data information includes information in a Graphic Design System (GDS) format.

10. A computer program product comprises a computer readable program stored in a non-transitory computer readable medium, the computer readable program is executed by a computer to provide compliant mapping between chip bond locations of an integrated circuit (IC) chip and package bond locations of a package in which said IC chip is to be positioned, the computer program comprising:
   program code for obtaining package design information relating to said package, said package design information including package bond location information;
   program code for accessing IC mask data information relating to said IC chip, said IC mask data information including chip bond location information for said IC chip;
   program code for integrating said package bond location information with said IC mask data information, said package bond location information comprising a virtual representation of a plurality of package bonds for said package and said IC mask data information comprising a virtual representation of a plurality of chip bonds of said IC chip; and
   program code for verifying that said package bond location information matches said chip bond location information by using an internal physical design verification tool, wherein the internal physical design verification tool is implemented by the computer.

11. The computer program product as set forth in claim 10, further comprising program code for modifying said package bond location information by positioning a bumper boundary around at least one of said package bond locations.

12. The computer program product as set forth in claim 10, wherein the program code for verifying that said package bond location information matches said chip bond location information further comprises program code for verifying that said package bond locations align with said chip bond locations.

13. The computer program product as set forth in claim 10, wherein the program code for verifying that said package bond location information matches said chip bond location information further comprises program code for verifying that package bond location names of said package bond locations correspond with chip bond location names of said chip bond locations.

14. The computer program product as set forth in claim 10, wherein the program code for verifying that said package bond location information matches said chip bond location information further comprises program code for verifying that the number of said package bond locations corresponds with the number of chip bond locations.

15. The computer program product as set forth in claim 10, wherein the program code for accessing IC mask data information relating to said IC chip further comprises:
- program code for creating a mirror image of said IC mask data information; and
- program code for extracting passivation data from mirror image data, said passivation data including chip bond location information for said IC chip.

16. A non-transitory computer-accessible medium storing a computer readable program to be executed on a computer system, said medium comprising instructions which, when executed on said computer system, perform the steps:
- obtaining package design information relating to said package, said package design information including package bond location information;
- accessing IC mask data information relating to said IC chip, said IC mask data information including chip bond location information for said IC chip;
- integrating said package bond location information with said IC mask data information, said package bond location information comprising a virtual representation of a plurality of package bonds for said package and said IC mask data information comprising a virtual representation of a plurality of chip bonds of said IC chip; and
- verifying that said package bond location information matches said chip bond location information by using an internal physical design verification tool, wherein the internal physical design verification tool is implemented by said computer system.

17. The computer-accessible medium as set forth in claim 16, further comprising instructions for modifying said package bond location information by positioning a bumper boundary around at least one of said package bond locations.

18. The computer-accessible medium as set forth in claim 16, wherein the step of verifying that said package bond location information matches said chip bond location information further comprises the step of verifying that said package bond locations align with said chip bond locations.

19. The computer-accessible medium as set forth in claim 16, wherein the step of verifying that said package bond location information matches said chip bond location information further comprises the step of verifying that package bond location names of said package bond locations correspond with chip bond location names of said chip bond locations.

20. The computer-accessible medium as set forth in claim 16, wherein the step of verifying that said package bond location information matches said chip bond location information further comprises the step of verifying that the number of package bond locations corresponds with the number of said chip bond locations.

21. The computer-accessible medium as set forth in claim 16, wherein the step of accessing IC mask data information relating to said IC chip further comprises the steps of:
- creating a mirror image of said IC mask data information; and
- extracting passivation data from mirror image data, said passivation data including chip bond location information for said IC chip.

22. A design system for providing compliant mapping between chip bond locations of an integrated circuit (IC) chip and package bond locations of a package in which said IC chip is to be positioned, the design system comprising:
- means for obtaining package design information relating to said package, said package design information including package bond location information;
- means for accessing IC mask data information relating to said IC chip, said IC mask data information including chip bond location information for said IC chip;
- means for integrating said package bond location information with said IC mask data information, said package bond location information comprising a virtual representation of a plurality of package bonds for said package and said IC mask data information comprising a virtual representation of a plurality of chip bonds of said IC chip; and
- means for verifying that said package bond location information matches said chip bond location information by using an internal physical design verification tool, wherein the internal physical design verification tool is implemented by a computer.

23. The design system as set forth in claim 22, further comprising means for modifying said package bond location information by positioning a bumper boundary around at least one of said package bond locations.

24. The design system as set forth in claim 22, wherein means for verifying that said package bond location information matches said chip bond location information further comprises means for verifying that said package bond locations align with said chip bond locations.

25. The design system as set forth in claim 22, wherein the means for verifying that said package bond location information matches said chip bond location information further comprises means for verifying that package bond location names of said package bond locations correspond with chip bond location names of said chip bond locations.

26. The design system as set forth in claim 22, wherein the means for verifying that said package bond location information matches said chip bond location information further comprises means for verifying that the number of said package bond locations corresponds with the number of said chip bond locations.

27. The design system as set forth in claim 22, wherein means for accessing IC mask data information relating to said IC chip further comprises:
- means for creating a mirror image of said IC mask data information; and
- means for extracting passivation data from mirror image data, said passivation data including chip bond location information for said IC chip.

28. The design system as set forth in claim 22, wherein said internal physical design verification tool includes a Design Rules Check (DRC) tool.

29. The design system as set forth in claim 22, wherein said package design information includes information in an Advanced Package Designer (APD) format.

30. The design system as set forth in claim 22, wherein said IC mask data information includes information in a Graphic Design System (GDS) format.

* * * * *

UNITED STATES PATENT AND TRADEMARK OFFICE
CERTIFICATE OF CORRECTION

PATENT NO. : 8,181,125 B2
APPLICATION NO. : 10/212360
DATED : May 15, 2012
INVENTOR(S) : Jason Harold Culler et al.

It is certified that error appears in the above-identified patent and that said Letters Patent is hereby corrected as shown below:

In column 7, line 28, in Claim 1, after "positioned," delete "the method".

In column 8, line 12, in Claim 7, delete "(ARC)" and insert -- (DRC) --, therefor.

Signed and Sealed this
Twenty-fifth Day of December, 2012

David J. Kappos
*Director of the United States Patent and Trademark Office*